United States Patent
Seo et al.

(10) Patent No.: US 7,638,437 B2
(45) Date of Patent: Dec. 29, 2009

(54) IN-SITU THIN-FILM DEPOSITION METHOD

(75) Inventors: Tae Wook Seo, Pyungtaek (KR); Young Hoon Park, Pyungtaek (KR)

(73) Assignee: IPS Ltd., Pyungtaek, Kyungki-do (KR)

( * ) Notice: Subject to any disclaimer, the term of this patent is extended or adjusted under 35 U.S.C. 154(b) by 341 days.

(21) Appl. No.: 11/260,559

(22) Filed: Oct. 27, 2005

(65) Prior Publication Data

US 2006/0148268 A1    Jul. 6, 2006

(30) Foreign Application Priority Data

Dec. 31, 2004    (KR) .................. 10-2004-0117942

(51) Int. Cl.
*H01L 21/31* (2006.01)
*H01L 21/469* (2006.01)
(52) U.S. Cl. .............. 438/758; 257/E21.171
(58) Field of Classification Search .......... 438/758; 257/E21.171
See application file for complete search history.

(56) References Cited

U.S. PATENT DOCUMENTS

| | | | |
|---|---|---|---|
| 6,472,756 B2 * | 10/2002 | Doan et al. ............. 257/770 |
| 6,495,461 B2 * | 12/2002 | Tsubouchi et al. ......... 438/683 |
| 6,998,014 B2 * | 2/2006 | Chen et al. ............ 156/345.34 |
| 2003/0143841 A1 * | 7/2003 | Yang et al. ............. 438/656 |
| 2004/0127027 A1 * | 7/2004 | Lee et al. .............. 438/683 |
| 2004/0180543 A1 | 9/2004 | Lee et al. |
| 2005/0042865 A1 * | 2/2005 | Cabral et al. ............ 438/680 |
| 2005/0266684 A1 * | 12/2005 | Lee et al. ............... 438/653 |
| 2006/0127601 A1 * | 6/2006 | Murakami et al. ......... 427/569 |

FOREIGN PATENT DOCUMENTS

| | | |
|---|---|---|
| JP | 06061181 | 3/1994 |
| JP | 06-061181 | 4/1994 |
| JP | 08-250433 | 9/1996 |
| JP | 11-150084 | 2/1999 |
| JP | 11150084 | 6/1999 |
| JP | 04-536224 | 1/2003 |
| JP | 2004-253797 | 9/2004 |
| JP | 2004253797 | 9/2004 |
| KR | 100338094 B1 | 4/1995 |
| KR | 100176197 B1 | 2/1996 |

OTHER PUBLICATIONS

Taiwan Search Report for Patent Application No. 094121143, filing date of Oct. 17, 2005.
Japanese Office Action issued on Sep. 30, 2008 for Japanese Patent Application No. 2005-311179.

* cited by examiner

*Primary Examiner*—Kiesha L. Rose
*Assistant Examiner*—Igwe U Anya
(74) *Attorney, Agent, or Firm*—Jason Y. Pahng

(57) ABSTRACT

Provided is an in-situ thin-film deposition method in which a $TiSi_x/Ti$ layer or $TiSi_x/Ti/TiN$ layer can be continuously deposited. The method serves to deposit a thin layer as a resistive contact and barrier on a loaded wafer and is performed in a thin-film deposition apparatus including a transfer chamber having a robot arm therein and a plurality of chambers installed as a cluster type on the transfer chamber. The method includes depositing a $TiSi_x$ layer on the wafer by supplying a first reactive gas containing Ti and a second reactive gas containing Si to a first chamber; and transferring the wafer to a second chamber using the transfer chamber and depositing a TiN layer on the $TiSi_x$ layer.

9 Claims, 15 Drawing Sheets

IN-SITU THIN-FILM DEPOSITION METHOD

CROSS-REFERENCE TO RELATED PATENT APPLICATION

This application claims the benefit of Korean Patent Application No. 10-2004-0117942, filed on Dec. 31, 2004, in the Korean Intellectual Property Office, the disclosure of which is incorporated herein in its entirety by reference.

BACKGROUND OF THE INVENTION

1. Field of the Invention

The present invention relates to a thin-film deposition method, and more particularly, to a method of depositing a thin layer in-situ in which a $TiSi_x/Ti$ layer or $TiSi_x/Ti/TiN$ layer can be continuously deposited on a wafer while applying low-power plasma at a low temperature.

2. Description of the Related Art

In the semiconductor industry, there is a growing tendency to attempt at further reducing the linewidth of circuits and further lowering a temperature at which a thin layer is deposited, and these attempts have been rewarded with good results. Still, a barrier metal deposition process adopts a high-temperature process that is performed while maintaining a wafer at a temperature of 600° C. or higher. In particular, when a continuous Ti/TiN deposition process is carried out using a conventional chemical vapor deposition (CVD) process, a wafer is maintained at about 600° C. or higher to form a $TiSi_x$ resistive region on a contact of a device, and a low-power plasma application process is required to prevent damage of the device.

However, to maintain the wafer at a high temperature and to apply low-power plasma are disadvantageous to improving the purity of a layer and increasing deposition speed. Accordingly, a new thin-film deposition method is required to perform a contact barrier metal process while maintaining a wafer at a low temperature and applying low-power plasma.

SUMMARY OF THE INVENTION

The present invention provides an in-situ thin-film deposition method in which a $TiSi_x$ layer is deposited as a resistive region on a wafer and a Ti or Ti/TiN layer is continuously and effectively deposited on the $TiSi_x$ layer.

The present invention also provides an in-situ thin-film deposition method in which a Ti or Ti/TiN layer is continuously deposited on a $TiSi_x$ layer by applying low-power plasma at a low temperature of 600° C. or lower.

According to a first embodiment of the present invention, there is provided an in-situ thin-film deposition method for depositing a thin layer as a resistive contact and barrier on a loaded wafer, which is performed in a thin-film deposition apparatus comprising a transfer chamber including a robot arm and a plurality of chambers installed as a cluster type on the transfer chamber. The method includes depositing a $TiSi_x$ layer on the wafer by supplying a first reactive gas containing Ti and a second reactive gas containing Si to a first chamber; and transferring the wafer to a second chamber using the transfer chamber and depositing a TiN layer on the $TiSi_x$ layer.

According to a second embodiment of the present invention, there is provided an in-situ thin-film deposition method for depositing a thin layer as a resistive contact and barrier on a loaded wafer, which is performed in a thin-film deposition apparatus comprising a transfer chamber including a robot arm and first, second, third, and fourth chambers installed as a cluster type on the transfer chamber. The method includes depositing a $TiSi_x$ layer on the wafer by supplying a first reactive gas containing Ti and a second reactive gas containing Si to the first chamber; depositing a Ti layer on the $TiSi_x$ layer, which is a glue layer; and transferring the wafer to the third chamber and depositing a TiN layer on the Ti layer.

According to a third embodiment of the present invention, there is provided an in-situ thin-film deposition method for depositing a thin layer as a resistive contact and barrier on a loaded wafer, which is performed in a thin-film deposition apparatus comprising a transfer chamber including a robot arm and a plurality of chambers installed as a cluster type on the transfer chamber. The method includes depositing a Ti layer on the wafer by alternately supplying a first reactive gas containing Ti and a second reactive gas containing H to a first chamber; forming a $TiSi_x$ reactive contact region by supplying additional thermal energy to cause a combination reaction between a Si underlying layer of the wafer and the Ti layer; and transferring the wafer to a second chamber using the transfer chamber and depositing a TiN layer on the $Ti/TiSi_x$ resistive contact region.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

A method of depositing a thin layer on a wafer in-situ will now be described more fully hereinafter with reference to the accompanying drawings, in which exemplary embodiments of the invention are shown.

Figure 1:
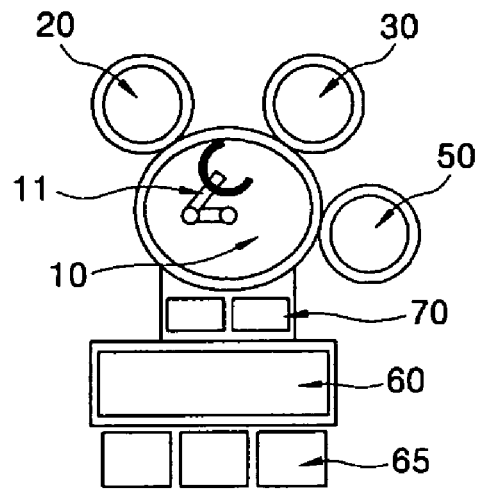
FIG. 1 illustrates a cluster-type thin-film deposition apparatus that is used to perform an in-situ thin-film deposition method according to a first exemplary embodiment of the present invention.
Figure 2:
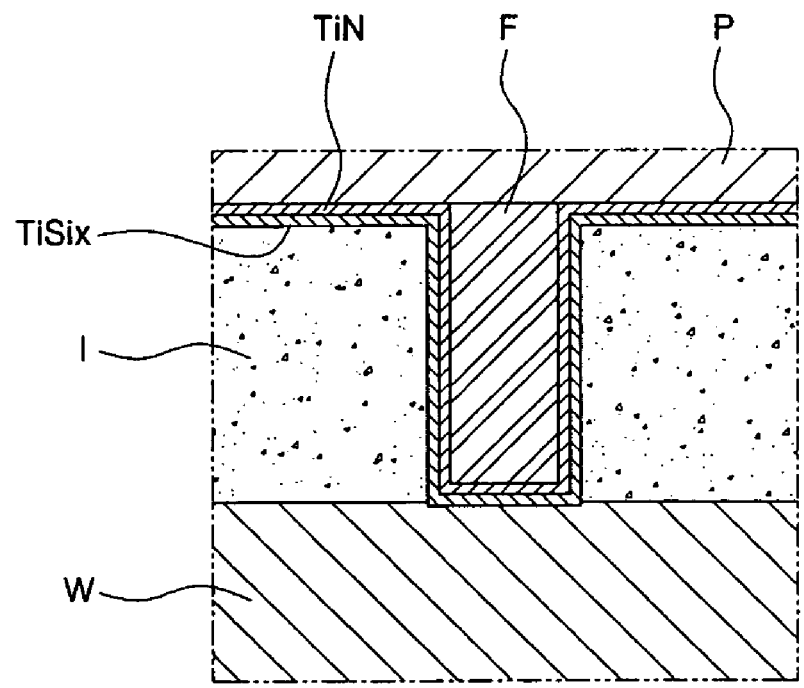
FIG. 2 is a cross sectional view of a wafer on which a $TiSi_x/TiN$ layer is formed according to the first exemplary embodiment of the present invention.

FIG. 1 illustrates a cluster-type thin-film deposition apparatus that is used to perform an in-situ thin-film deposition method according to a first exemplary embodiment of the present invention, and FIG. 2 is a cross sectional view of a wafer on which a $TiSi_x/TiN$ layer is formed according to the first exemplary embodiment of the present invention.

Referring to FIG. 1, the in-situ thin-film deposition method according to the first exemplary embodiment of the present invention is performed in a cluster-type thin-film deposition apparatus, which includes a transfer chamber 10, first, second, and third chambers 20, 30, and 50, a transfer unit 60, and a load lock 70. A robot arm 11 is installed in the transfer chamber 10. The first, second, and third chambers 20, 30, and 50 are installed as a cluster type on the transfer chamber 10 and used to deposit a thin layer on a wafer "w" loaded therein. A load port module (LPM) 65 on which a plurality of wafers "w" are mounted is installed on the transfer unit 60. The load lock 70 connects the transfer chamber 10 and the transfer unit 60. A thin layer for a resistive contact and barrier is deposited on the wafer "w" using the above-described cluster-type thin-film deposition apparatus. This deposition process will now be described in detail.

At the outset, a first reactive gas containing Ti and a second reactive gas containing Si are injected into an arbitrary chamber (Hereinafter, it will be referred to as a first chamber 20 for clarity of explanation) so that a $TiSi_x$ layer is deposited on a wafer "w," specifically, on an inner circumferential surface of a contact hole formed in an interlayer dielectric layer "I" ($TiSi_x$ layer deposition operation S10). In this case, the operation S10 may be performed using a plasma atomic layer deposition (ALD) process or plasma chemical vapor deposition (CVD) process in which plasma is applied to the first chamber 20.

Thereafter, the wafer "w" is transferred to the third chamber 50 for post-processing through the transfer chamber 10, and a post-processing gas containing H is sprayed onto the wafer "w" to reduce the content of impurities in the $TiSi_x$ layer (post-processing operation S25). In this case, when the post-processing gas further contains an N-containing gas, the content of impurities in the $TiSi_x$ layer can be further reduced and a top surface of the $TiSi_x$ layer can be nitrified. This operation S25 may be performed by applying plasma to the third chamber 50.

To deposit the $TiSi_x$ layer, the first reactive gas may be one selected from the group consisting of $TiCl_4$, TEMATi, and TDMATi, and the second reactive gas may be one of $SiH_4$ and DCS. Also, the $TiSi_x$ layer is deposited on the wafer "w" maintained at a temperature of 550° C. or less in the first chamber 20 maintained under a pressure of 0.1 to 10 Torr.

Also, when the $TiSi_x$ layer is deposited using the plasma ALD process, a purge process is carried out by injecting a purge gas into the first chamber 20. In this case, the purge gas may be at least one selected from the group consisting of Ar, He, Ne, Xe, and $N_2$.

Thereafter, the wafer "w" is transferred to another chamber, for example, the second chamber 30, through the transfer chamber 10, and a TiN thin layer is deposited on the $TiSi_x$ layer (TiN layer deposition operation S30).

Then, a metal plug (not shown) is deposited on the TiN layer, and an interconnection is formed. Thus, the resultant structure is completed as shown in FIG. 2.

Hereinafter, various examples of a process of depositing the $TiSi_x$ layer using a plasma ALD process will be described.

Figure 3:
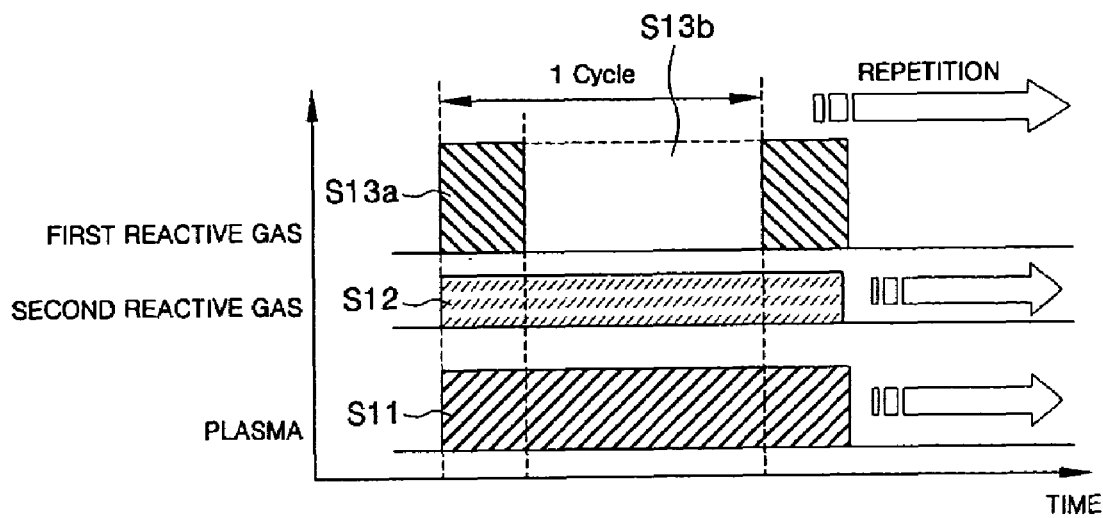
FIG. 3 illustrates a first example of a process sequence in which the $TiSi_x$ layer of FIG. 2 is formed.

FIG. 3 illustrates a first example of a process sequence in which the $TiSi_x$ layer of FIG. 2 is formed.

Referring to FIG. 3, in the first example in which the $TiSi_x$ layer is deposited using a plasma ALD process in the first chamber 20, while power is being supplied to the first chamber 20 so that plasma is continuously applied to the first chamber 20 (plasma continuous application operation S11), the second reactive gas is continuously sprayed onto the wafer "w" (second reactive gas continuous feeding operation S12) at the same time. During the second reactive gas continuous feeding operation S12, first reactive gas feeding operation S13a of pulse-spraying the first reactive gas and first reactive gas purge operation S13b of purging the first reactive gas that is not absorbed on the wafer "w" are repeated in several cycles until the $TiSi_x$ layer is deposited on the wafer "w."

Figure 4:
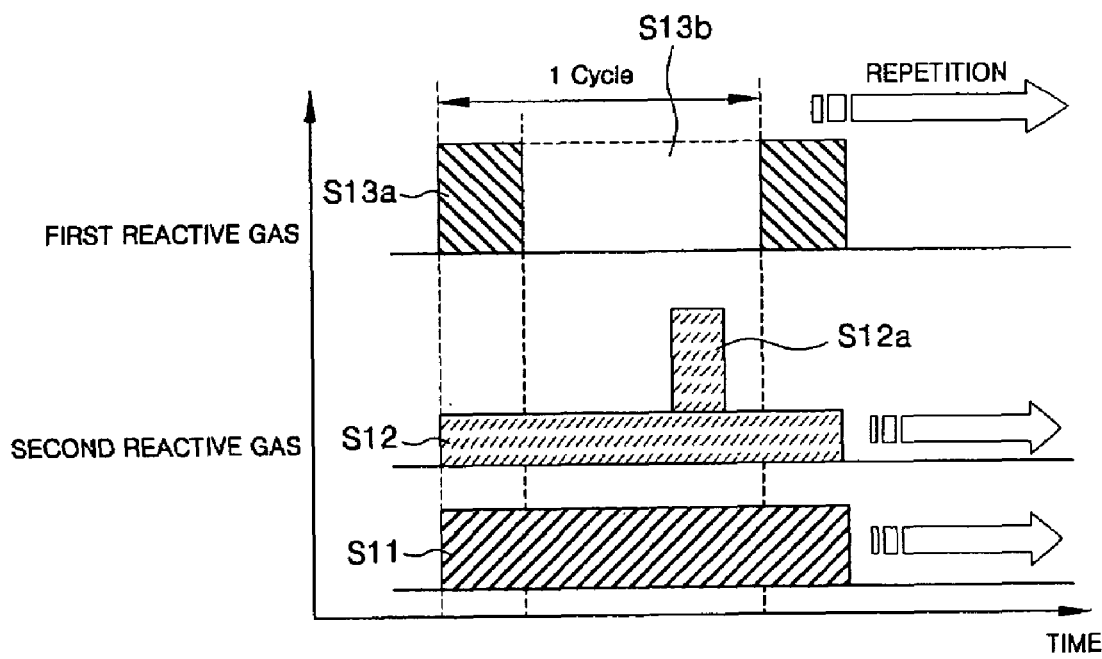
FIG. 4 illustrates a second example of a process sequence in which the $TiSi_x$ layer of FIG. 2.

FIG. 4 illustrates a second example of a process sequence in which the $TiSi_x$ layer of FIG. 2 is formed.

Referring to FIG. 4, in the second example in which the $TiSi_x$ layer is deposited using a plasma ALD process in the first chamber 20, while power is being supplied to the first chamber 20 so that plasma is continuously applied to the first chamber 20 (plasma continuous application operation S11), the second reactive gas is continuously sprayed onto the wafer "w" (second reactive gas continuous feeding operation S12) at the same time. During the second reactive gas continuous feeding operation S12, first reactive gas feeding operation S13a of pulse-spraying the first reactive gas and first reactive gas purge operation S13b of purging the first reactive gas that is not absorbed on the wafer "w" are repeated in several cycles until the $TiSi_x$ layer is deposited on the wafer "w."

In this case, the second reactive gas continuous feeding operation S12 includes second reactive gas impulse operation S12a in which the second reactive gas is impulse-sprayed at a higher flow rate than a normal flow rate. The second reactive gas impulse operation S12a is performed during the first reactive gas purge operation S13b. In other words, the second example is different from the first example in that the second reactive gas continuous feeding operation S12 includes the second reactive gas impulse operation S12a that is performed during the first reactive gas purge operation S13b.

Figure 5:
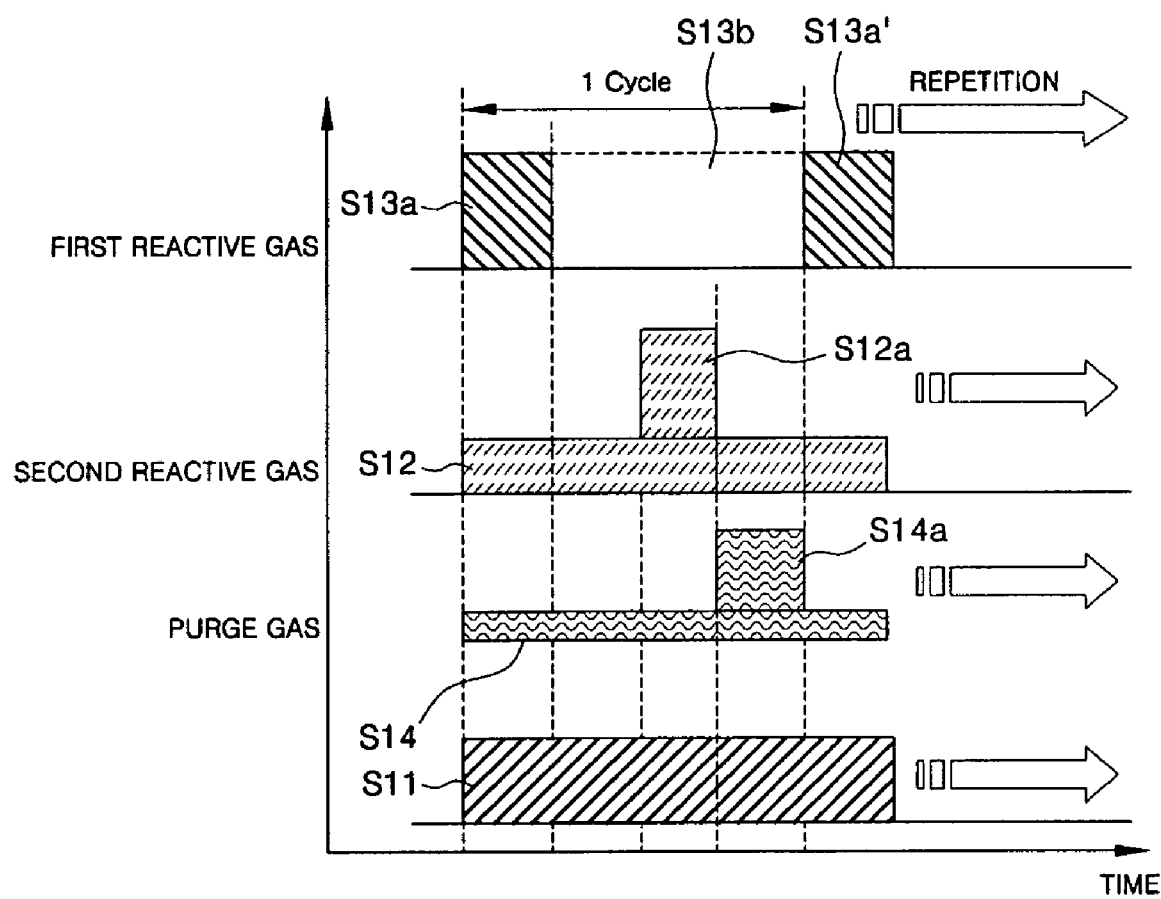
FIG. 5 illustrates a third example of a process sequence in which the $TiSi_x$ layer of FIG. 2 is formed.

FIG. 5 illustrates a third example of a process sequence in which the $TiSi_x$ layer of FIG. 2 is formed.

Referring to FIG. 5, in the third example in which the $TiSi_x$ layer is deposited using a plasma ALD process in the first chamber 20, while power is being supplied to the first chamber 20 so that plasma is continuously applied to the first chamber 20 (plasma continuous application operation S11), the second reactive gas is continuously sprayed onto the wafer "w" (second reactive gas continuous feeding operation S12), and a small purge gas is continuously supplied onto the wafer "w" (small purge gas continuous feeding operation S14) at the same time.

During the second reactive gas continuous feeding operation S12, first reactive gas feeding operation S13a of pulse-spraying the first reactive gas and first reactive gas purge operation S13b of purging the first reactive gas that is not absorbed on the wafer "w" are repeated in several cycles until the TiSi$_x$ layer is deposited on the wafer "w."

In this case, the second reactive gas continuous feeding operation S12 includes second reactive gas impulse operation S12a in which the second reactive gas is impulse-sprayed at a higher flow rate than a normal flow rate. The second reactive gas impulse operation S12a is performed during the first reactive gas purge operation S13b.

Also, the small purge gas continuous feeding operation S14 includes purge gas impulse operation S14a in which the purge gas is impulse-sprayed at a higher flow rate than a normal flow rate. The purge gas impulse operation S14a starts after the second reactive gas impulse operation S12a and comes to an end at the same time as when first reactive gas feeding operation S13' starts in the next cycle.

In other words, the third example is different from the second example in that a cycle includes the small purge gas continuous feeding operation S14, which includes the purge gas impulse operation S14a that starts at the same time as when the second reactive gas impulse operation S12a ends and comes to an end at the same time as when the first reactive gas feeding operation S13' starts in the next cycle.

Figure 6:
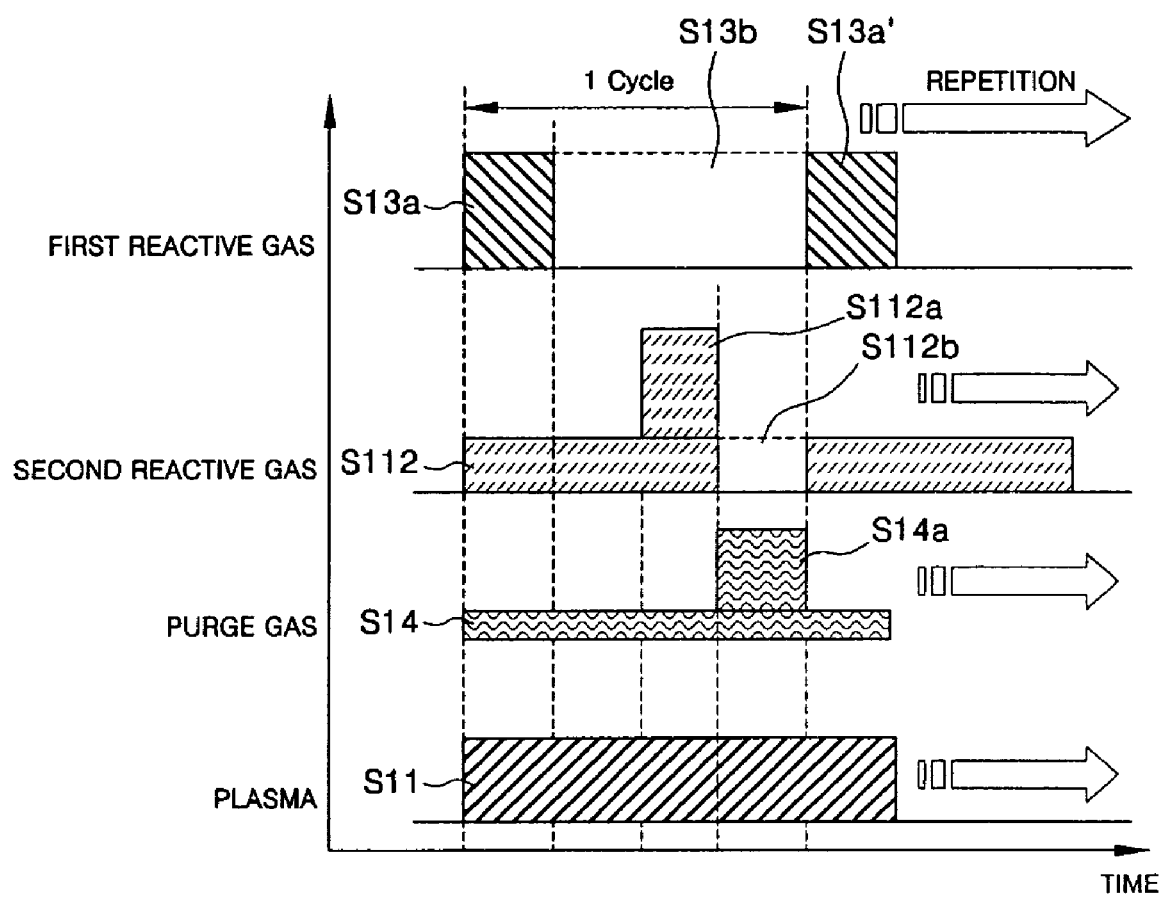
FIG. 6 illustrates a fourth example of a process sequence in which the $TiSi_x$ layer of FIG. 2 is formed.

FIG. 6 illustrates a fourth example of a process sequence in which the TiSi$_x$ layer of FIG. 2 is formed.

Referring to FIG. 6, in the fourth example in which the TiSi$_x$ layer is deposited using a plasma ALD process in the first chamber 20, while power is being supplied to the first chamber 20 so that plasma is continuously applied to the first chamber 20 (plasma continuous application operation S11), the second reactive gas is discontinuously sprayed onto the wafer "w" (second reactive gas discontinuous feeding operation S112), and a small purge gas is continuously supplied onto the wafer "w" (small purge gas continuous feeding operation S14) at the same time.

During the second reactive gas discontinuous feeding operation S112, first reactive gas feeding operation S13a of pulse-spraying the first reactive gas and first reactive gas purge operation S13b of purging the first reactive gas that is not absorbed on the wafer "w" are repeated in several cycles until the TiSi$_x$ layer is deposited on the wafer "w."

In this case, the second reactive gas discontinuous feeding operation S112 includes second reactive gas impulse operation S112a and second reactive gas feeding stop operation S112b. During the second reactive gas impulse operation S112a, the second reactive gas is impulse-sprayed at a higher flow rate than a normal flow rate. The second reactive gas impulse operation S112a is performed during the first reactive gas purge operation S13b. The second reactive gas feeding stop operation S112b starts after the second reactive gas impulse operation S112a and comes to an end at the same time as when first reactive gas feeding operation S13a' starts in the next cycle.

Also, the small purge gas continuous feeding operation S14 includes purge gas impulse operation S14a in which the purge gas is impulse-sprayed at a higher flow rate than a normal flow rate. The purge gas impulse operation S14a is performed at the same time as the second reactive gas feeding stop operation S112b.

In other words, the fourth example is different from the third example in that a cycle includes the second reactive gas discontinuous feeding operation S112, which is divided into the second reactive gas impulse operation S112a and the second reactive gas feeding stop operation S112b. Also, unlike in the third example, the small purge gas continuous feeding operation S14 includes the purge gas impulse operation S14a, which is performed at the same time as the second reactive gas feeding stop operation S112b.

Figure 7:
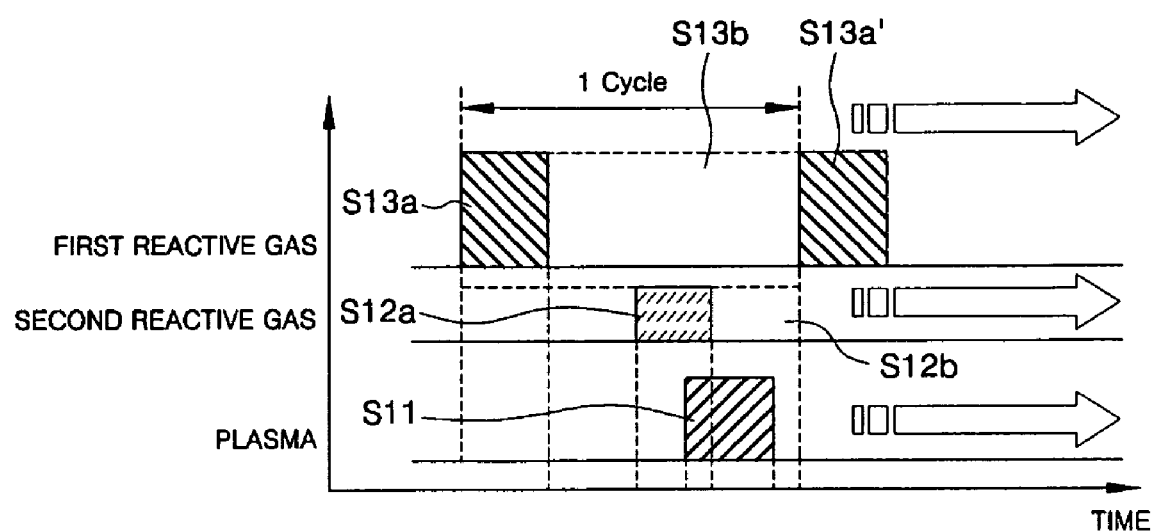
FIG. 7 illustrates a fifth example of a process sequence in which the $TiSi_x$ layer of FIG. 2 is formed.

FIG. 7 illustrates a fifth example of a process sequence in which the TiSi$_x$ layer of FIG. 2 is formed.

Referring to FIG. 7, in the fifth example in which the TiSi$_x$ layer is deposited using a plasma ALD process in the first chamber 20, first reactive gas feeding operation S13a of pulse-spraying the first reactive gas, first reactive gas purge operation S13b of purging the first reactive gas that is not absorbed on the wafer "w," second reactive gas feeding operation S12a of pulse-spraying the second reactive gas, and second reactive gas purge operation S12b of purging the second reactive gas that does not react with the first reactive gas absorbed on the wafer "w" or by-products that are generated by a reaction between the first and second gases are repeated in several cycles until the TiSi$_x$ layer is deposited on the wafer "w."

During the repetition of the cycle of operations S13a, S13b, S12a, and S12b, power is supplied to the first chamber 20 so that plasma is applied to the first chamber 20 (plasma application operation S11). The plasma application operation S11 starts during the second reactive gas feeding operation S12a and comes to an end before first reactive gas feeding operation S13a' starts in the next cycle.

Figure 8:
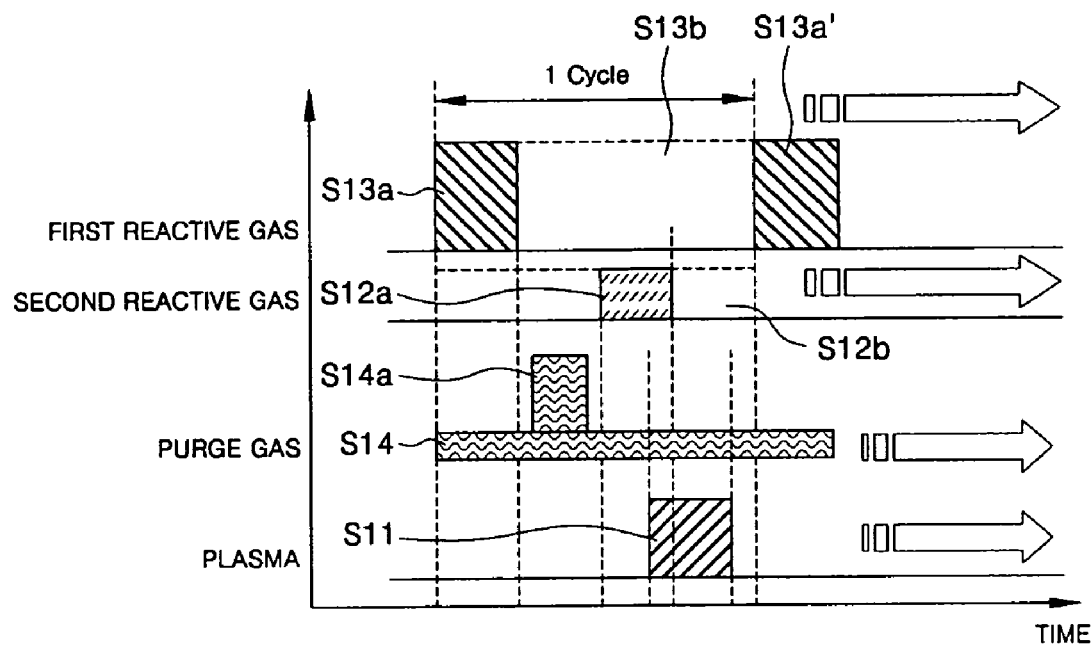
FIG. 8 illustrates a sixth example of a process sequence in which the $TiSi_x$ layer of FIG. 2 is formed.

FIG. 8 illustrates a sixth example of a process sequence in which the TiSi$_x$ layer of FIG. 2 is formed.

Referring to FIG. 8, in the sixth example in which the TiSi$_x$ layer is deposited using a plasma ALD process in the first chamber 20, first reactive gas feeding operation S13a of pulse-spraying the first reactive gas, first reactive gas purge operation S13b of purging the first reactive gas that is not absorbed on the wafer "w," second reactive gas feeding operation S12a of pulse-spraying the second reactive gas, and second reactive gas purge operation S12b of purging the second reactive gas that does not react with the first reactive gas absorbed on the wafer "w" or by-products that are generated by a reaction between the first and second gases are repeated in several cycles. During the repetition of the cycle of operations S13a, S13b, S12a, and S12b, a small purge gas is continuously supplied onto the wafer "w" (small purge gas continuous feeding operation S14). Thus, the TiSi$_x$ layer is deposited on the wafer "w."

During the repetition of the cycle of operations S13a, S13b, S12a, and S12b, power is supplied to the first chamber 20 so that plasma is applied to the first chamber 20 (plasma application operation S11). The plasma application operation S11 starts during the second reactive gas feeding operation S12a and comes to an end before first reactive gas feeding operation S13a' starts in the next cycle.

In this case, the small purge gas continuous feeding operation S14 includes purge gas impulse operation S14a in which the purge gas is impulse-sprayed at a higher flow rate than a normal flow rate. The purge gas impulse operation S14a starts after the first reactive gas feeding operation S13a and comes to an end before the second reactive gas feeding operation S12a starts.

In other words, the sixth example is different from the fifth example in that a cycle includes the small purge gas continuous feeding operation S14, which includes the purge gas impulse operation S14a that starts after the first reactive gas feeding operation S13a and comes to an end before the second reactive gas feeding operation S12a starts.

Figure 9:
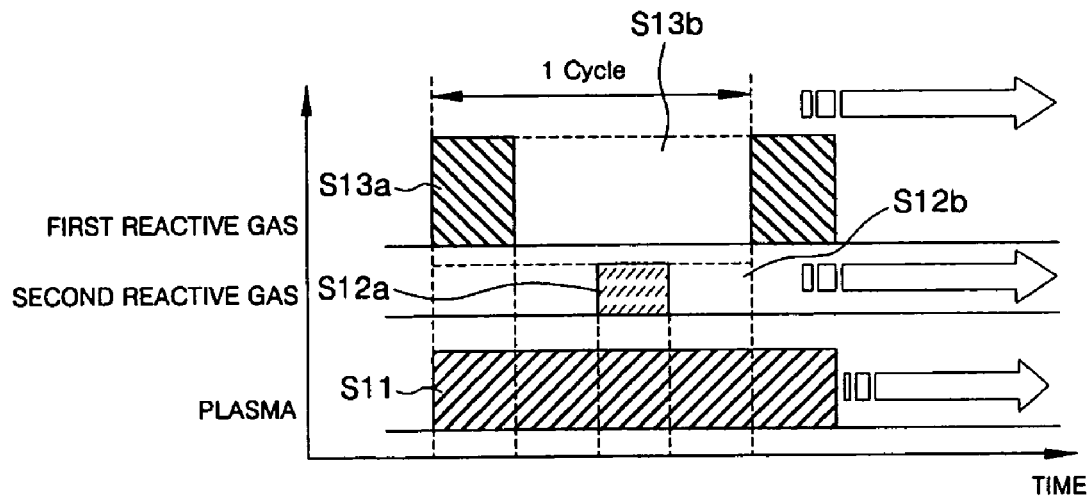
FIG. 9 illustrates a seventh example of a process sequence in which the $TiSi_x$ layer of FIG. 2 is formed.

FIG. 9 illustrates a seventh example of a process sequence in which the TiSi$_x$ layer of FIG. 2 is formed.

Referring to FIG. 9, in the seventh example in which the TiSi$_x$ layer is deposited using a plasma ALD process in the first chamber 20, first reactive gas feeding operation S13a of pulse-spraying the first reactive gas, first reactive gas purge operation S13b of purging the first reactive gas that is not absorbed on the wafer "w," second reactive gas feeding operation S12a of pulse-spraying the second reactive gas, and second reactive gas purge operation S12b of purging the second reactive gas that does not react with the first reactive gas absorbed on the wafer "w" or by-products that are generated by a reaction between the first and second gases are repeated in several cycles. During the repetition of the cycle of operations S13a, S13b, S12a, and S12b, power is supplied to the first chamber 20 so that plasma is continuously applied to the first chamber 20 (plasma continuous application operation S11). Thus, the TiSi$_x$ layer is deposited on the wafer "w."

Figure 10:
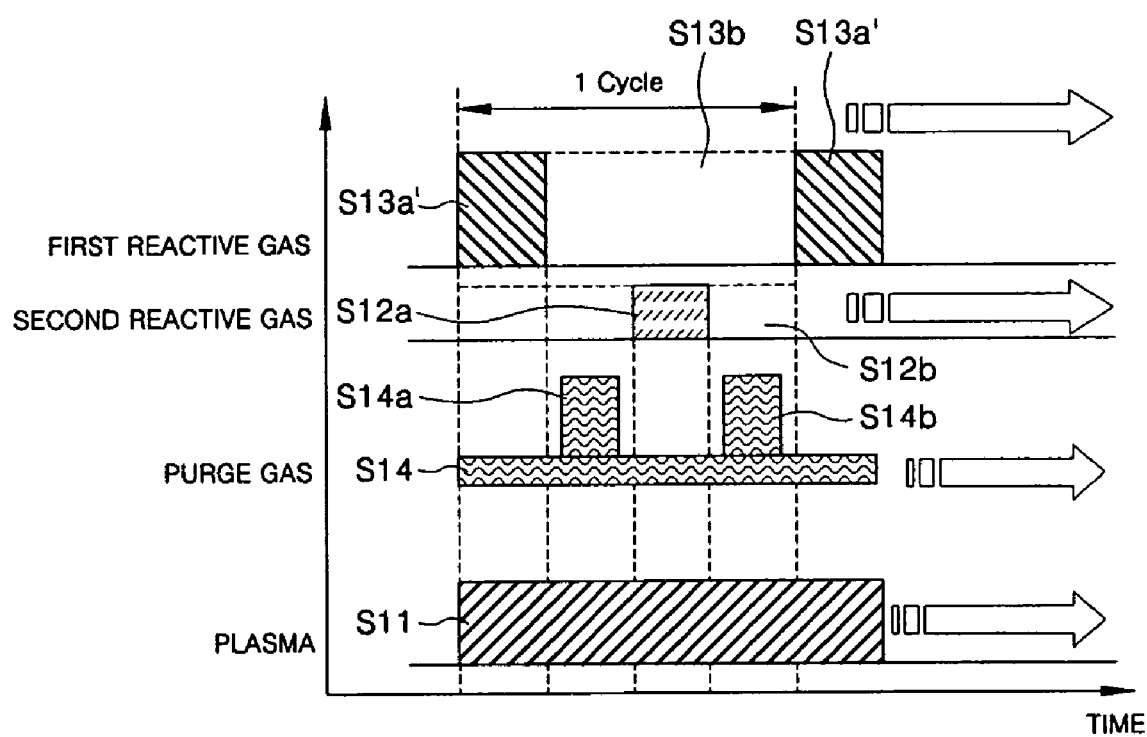
FIG. 10 illustrates an eighth example of a process sequence in which the $TiSi_x$ layer of FIG. 2 is formed.

FIG. 10 illustrates an eighth example of a process sequence in which the TiSi$_x$ layer of FIG. 2 is formed.

Referring to FIG. 10, in the eighth example in which the TiSi$_x$ layer is deposited using a plasma ALD process in the first chamber 20, first reactive gas feeding operation S13a of pulse-spraying the first reactive gas, first reactive gas purge operation S13b of purging the first reactive gas that is not absorbed on the wafer "w," second reactive gas feeding operation S12a of pulse-spraying the second reactive gas, and second reactive gas purge operation S12b of purging the second reactive gas that does not react with the first reactive gas absorbed on the wafer "w" or by-products that are generated by a reaction between the first and second gases are repeated in several cycles. During the repetition of the cycle of operations S13a, S13b, S12a, and S12b, a small purge gas is continuously supplied onto the wafer "w" (small purge gas continuous feeding operation S14), and power is supplied to the first chamber 20 so that plasma is continuously applied to the first chamber 20 (plasma continuous application operation S11) at the same time. Thus, the TiSi$_x$ layer is deposited on the wafer "w."

In this case, the small purge gas continuous feeding operation S14 includes first purge gas impulse operation S14a in which a first purge gas is impulse-sprayed at a higher flow rate than a normal flow rate and second purge gas impulse operation S14b in which a second purge gas is impulse-sprayed at a higher flow rate than a normal flow rate. The first purge gas impulse operation S14a starts after the first reactive gas feeding operation S13a and comes to an end before the second reactive gas feeding operation S12a starts, and the second purge gas impulse operation S14b starts after the second reactive gas feeding operation S12a and comes to an end before first reactive gas feeding operation S13a' starts in the next cycle.

In other words, the eighth example is different from the seventh example in that a cycle includes the small purge gas continuous feeding operation S14 in which a small purge gas is continuously supplied onto the wafer "w", and the small purge gas continuous feeding operation S14 is divided into the first purge gas impulse operation S14a, which starts after the first reactive gas feeding operation S13a and ends before the second reactive gas feeding operation S12a starts, and the second purge gas impulse operation S14b, which starts after the second reactive gas feeding operation S12a and ends before first reactive gas feeding operation S13a' starts in the next cycle.

Figure 11:
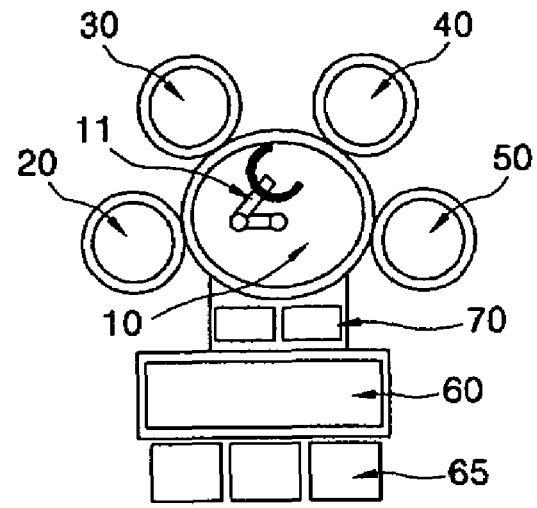
FIG. 11 illustrates a cluster-type thin-film deposition apparatus that is used to perform an in-situ thin-film deposition method according to a second exemplary embodiment of the present invention.
Figure 12:
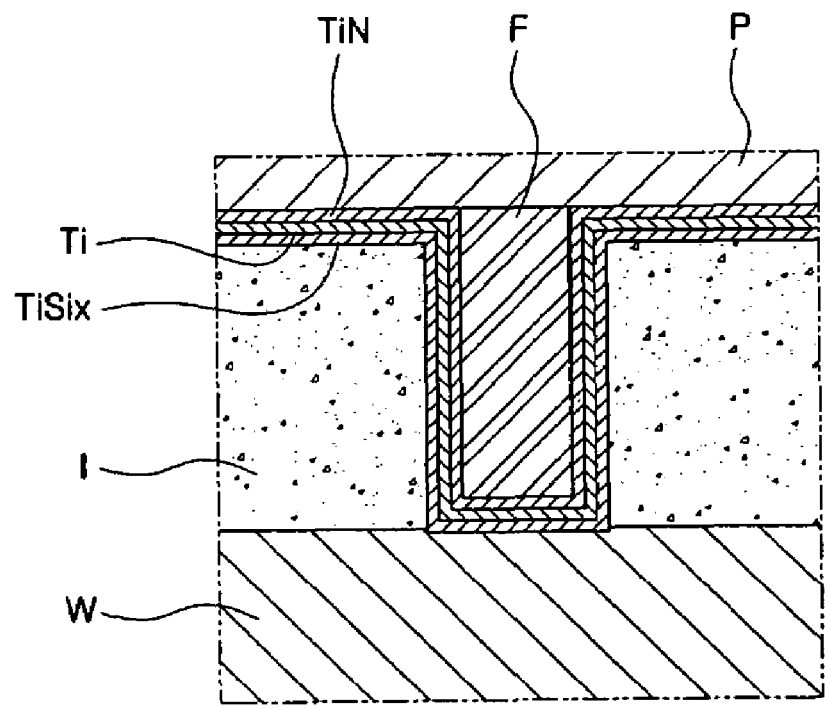
FIG. 12 is a cross sectional view of a wafer on which a $TiSi_x/Ti/TiN$ layer is formed according to the second exemplary embodiment of the present invention.

FIG. 11 illustrates a cluster-type thin-film deposition apparatus that is used to perform an in-situ thin-film deposition method according to a second exemplary embodiment of the present invention, and FIG. 12 is a cross sectional view of a wafer on which a TiSi$_x$/Ti/TiN layer is formed according to the second exemplary embodiment of the present invention.

Referring to FIG. 11, the in-situ thin-film deposition method according to the second exemplary embodiment of the present invention is performed in a cluster-type thin-film deposition apparatus, which includes a transfer chamber 10, first, second, third, and fourth chambers 20, 30, 40, and 50, a transfer unit 60, and a load lock 70. A robot arm 11 is installed in the transfer chamber 10. The first, second, third, and fourth chambers 20, 30, 40, and 50 are installed as a cluster type on the transfer chamber 10 and used to deposit a thin layer on a wafer "w" loaded therein. An LPM 65 on which a plurality of wafers "w" are mounted is installed on the transfer unit 60. The load lock 70 connects the transfer chamber 10 and the transfer unit 60. A thin layer for a resistive contact and barrier is deposited on the wafer "w" using the above-described cluster-type thin-film deposition apparatus. This deposition process will now be described in detail.

At the outset, a first reactive gas containing Ti and a second reactive gas containing Si are injected into a first chamber 20 so that a TiSi$_x$ layer is deposited on a wafer "w," specifically, on an inner circumferential surface of a contact hole formed in an interlayer dielectric layer "I" (TiSi$_x$ layer deposition operation S10). In this case, the operation S10 may be performed using a plasma ALD process or plasma CVD process in which plasma is applied to the first chamber 20.

Next, the wafer "w" is transferred to another chamber, for example, the second chamber 30, through the transfer chamber 10, and a Ti thin layer is deposited on the TiSi$_x$ layer, which is a glue layer (Ti layer deposition operation S20). Of course, it is possible to deposit the Ti layer on the TiSi$_x$ layer in the first chamber 20.

After the operations S10 and S20, the wafer "w" is transferred to the fourth chamber 50 for post-processing through the transfer chamber 10, and a post-processing gas containing H is sprayed onto the wafer "w" to reduce the content of impurities in the TiSi$_x$/Ti layer (post-processing operation S25). In this case, when the post-processing gas further contains an N-containing gas, the content of impurities in the TiSi$_x$/Ti layer can be further reduced and a top surface of the TiSi$_x$/Ti layer can be nitrified. This operation S25 may be performed by applying plasma to the fourth chamber 50.

To deposit the TiSi$_x$ layer, the first reactive gas may be one selected from the group consisting of TiCl$_4$, TEMATi, and TDMATi, and the second reactive gas may be one of SiH$_4$ and DCS. Also, the TiSi$_x$ layer is deposited on the wafer "w" maintained at a temperature of 550° C. or less in the first chamber 20 maintained under a pressure of 0.1 to 10 Torr.

Also, when the TiSi$_x$ layer is deposited using the plasma ALD process, a purge process is carried out by injecting a purge gas into the first chamber 20. In this case, the purge gas may be at least one selected from the group consisting of Ar, He, Ne, Xe, and N$_2$.

Thereafter, the wafer "w" is transferred to yet another chamber, for example, the third chamber 40, through the transfer chamber 10, and a TiN thin layer is deposited on the Ti layer (TiN layer deposition operation S30).

Then, a metal plug (not shown) is deposited on the TiN layer, and an interconnection is formed. Thus, the resultant structure is completed as shown in FIG. 12.

In the present embodiment, various examples of a process of depositing the TiSi$_x$ layer using the plasma ALD process are substantially almost the same as described in the previous embodiment, thus a description thereof will not be presented here.

Figure 13:
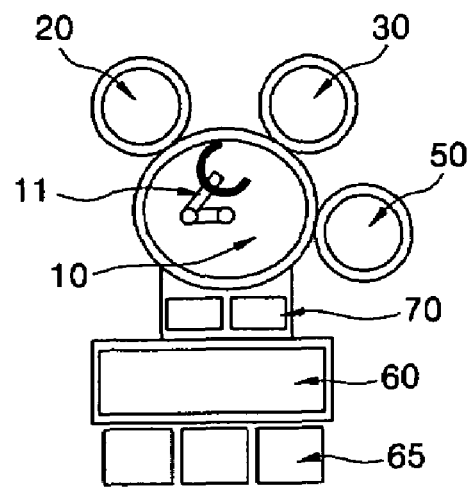
FIG. 13 illustrates a cluster-type thin-film deposition apparatus that is used to perform an in-situ thin-film deposition method according to a third exemplary embodiment of the present invention.
Figure 14:
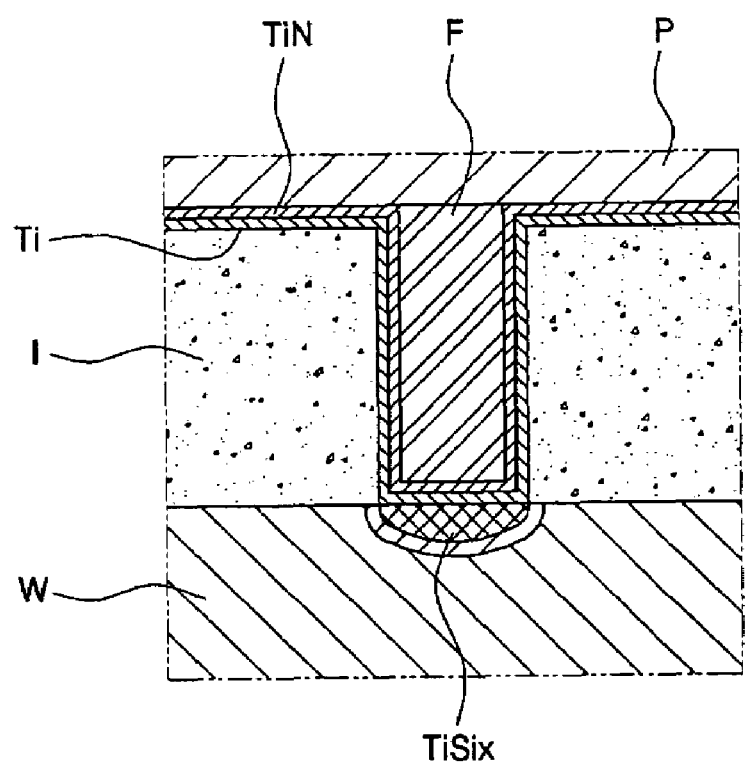
FIG. 14 is a cross sectional view of a wafer on which a TiN layer is formed on a $Ti/TiSi_x$ resistive contact region according to the third exemplary embodiment of the present invention.

FIG. 13 illustrates a cluster-type thin-film deposition apparatus that is used to perform an in-situ thin-film deposition method according to a third exemplary embodiment of the present invention, and FIG. 14 is a cross sectional view of a wafer on which a TiN layer is formed on a Ti/TiSi$_x$ resistive contact region according to the third exemplary embodiment of the present invention.

Referring to FIG. 13, the in-situ thin-film deposition method according to the third exemplary embodiment of the present invention is performed in a cluster-type thin-film deposition apparatus, which includes a transfer chamber 10, first, second, and third chambers 20, 30, and 40, a transfer unit 60, and a load lock 70. A robot arm 11 is installed in the transfer chamber 10. The first, second, and third chambers 20, 30, and 40 are installed as a cluster type on the transfer chamber 10 and used to deposit a thin layer on a wafer "w" loaded therein. An LPM 65 on which a plurality of wafers "w" are mounted is installed on the transfer unit 60. The load lock 70 connects the transfer chamber 10 and the transfer unit 60. A thin layer for a resistive contact and barrier is deposited on the wafer "w" using the above-described cluster-type thin-film deposition apparatus. This deposition process will now be described in more detail.

At the outset, a first reactive gas containing Ti and a second reactive gas containing H are alternately injected into a first chamber 20 so that a Ti layer is deposited on a wafer "w," specifically, on an inner circumferential surface of a contact hole formed in an interlayer dielectric layer "I" (Ti layer deposition operation S100). In this case, the operation S100 may be performed using a plasma ALD process in which plasma is applied to the first chamber 20.

In this case, additional thermal energy is supplied to the wafer "w" so that the Ti layer reacts with the Si underlying layer of wafer to form a TiSi$_x$ resistive contact region (thermal energy supply operation S200). The thermal energy supply operation S200 may be performed at the same time as the Ti layer deposition operation S100 or at a predetermined time interval after the operation S100.

After the operations S100, the wafer "w" is transferred to the third chamber 50 for post-processing through the transfer chamber 10, and a post-processing gas containing H is sprayed onto the wafer "w" to reduce the content of impurities in the Ti layer (post-processing operation S25). In this case, when the post-processing gas further contains an N-containing gas, the content of impurities in the Ti layer can be further reduced and a top surface of the Ti layer can be nitrified. This operation S25 may be performed by applying plasma to the third chamber 50.

To deposit the Ti layer, the first reactive gas may be one selected from the group consisting of TiCl$_4$, TEMATi, and TDMATi, and the second reactive gas may be H$_2$. Also, the Ti layer is deposited on the wafer "w" maintained at a temperature of 550° C. or less in the first chamber 20 maintained under a pressure of 0.1 to 10 Torr.

Also, when the Ti layer is deposited using the plasma ALD process, a purge process is carried out by injecting a purge gas into the first chamber 20. In this case, the purge gas may be at least one selected from the group consisting of Ar, He, Ne, Xe, and N$_2$.

Thereafter, the wafer "w" is transferred to another chamber, for example, the second chamber 30, through the transfer chamber 10, and a TiN thin layer is deposited on the Ti/TiSi$_x$ resistive contact region (TiN layer deposition operation S300).

Then, a metal plug (not shown) is deposited on the TiN layer, and an interconnection is formed. Thus, the resultant structure is completed as shown in FIG. 13.

Hereinafter, various examples of a process of depositing the Ti layer using a plasma ALD process will be described.

Figure 15:
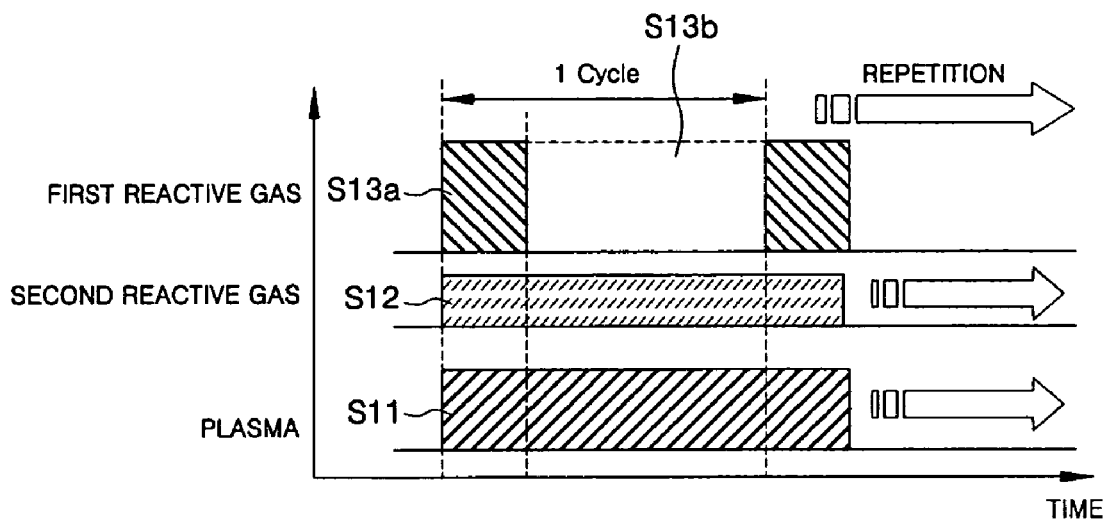
FIG. 15 illustrates a first example of a process sequence in which a Ti layer of FIG. 14 is formed.

FIG. 15 illustrates a first example of a process sequence in which the Ti layer of FIG. 14 is formed.

Referring to FIG. 15, in the first example in which the Ti layer is deposited using a plasma ALD process in the first chamber 20, while power is being supplied to the first chamber 20 so that plasma is continuously applied to the first chamber 20 (plasma continuous application operation S11), the second reactive gas is continuously sprayed onto the wafer "w" (second reactive gas continuous feeding operation S12) at the same time. During the second reactive gas continuous feeding operation S12, first reactive gas feeding operation S13a of pulse-spraying the first reactive gas and first reactive gas purge operation S13b of purging the first reactive gas that is not absorbed on the wafer "w" are repeated in several cycles until the Ti layer is deposited on the wafer "w."

Figure 16:
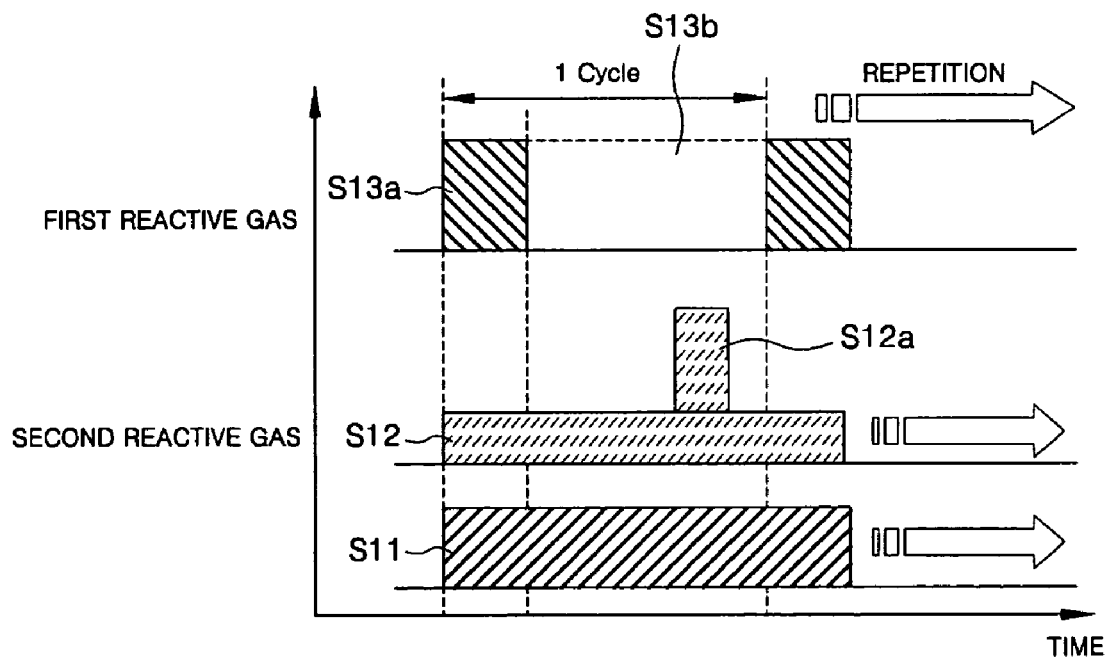
FIG. 16 illustrates a second example of a process sequence in which the Ti layer of FIG. 14 is formed.

FIG. 16 illustrates a second example of a process sequence in which the Ti layer of FIG. 14 is formed.

Referring to FIG. 16, in the second example in which the Ti layer is deposited using a plasma ALD process in the first chamber 20, while power is being supplied to the first chamber 20 so that plasma is continuously applied to the first chamber 20 (plasma continuous application operation S11), the second reactive gas is continuously sprayed onto the wafer "w" (second reactive gas continuous feeding operation S12) at the same time. During the second reactive gas continuous feeding operation S12, first reactive gas feeding operation S13a of pulse-spraying the first reactive gas and first reactive gas purge operation S13b of purging the first reactive gas that is not absorbed on the wafer "w" are repeated in several cycles until the Ti layer is deposited on the wafer "w."

In this case, the second reactive gas continuous feeding operation S12 includes second reactive gas impulse operation S12a in which the second reactive gas is impulse-sprayed at a higher flow rate than a normal flow rate. The second reactive gas impulse operation S12a is performed during the first reactive gas purge operation S13b. In other words, the second example is different from the first example in that the second reactive gas continuous feeding operation S12 includes the second reactive gas impulse operation S12a that is performed during the first reactive gas purge operation S13b.

Figure 17:
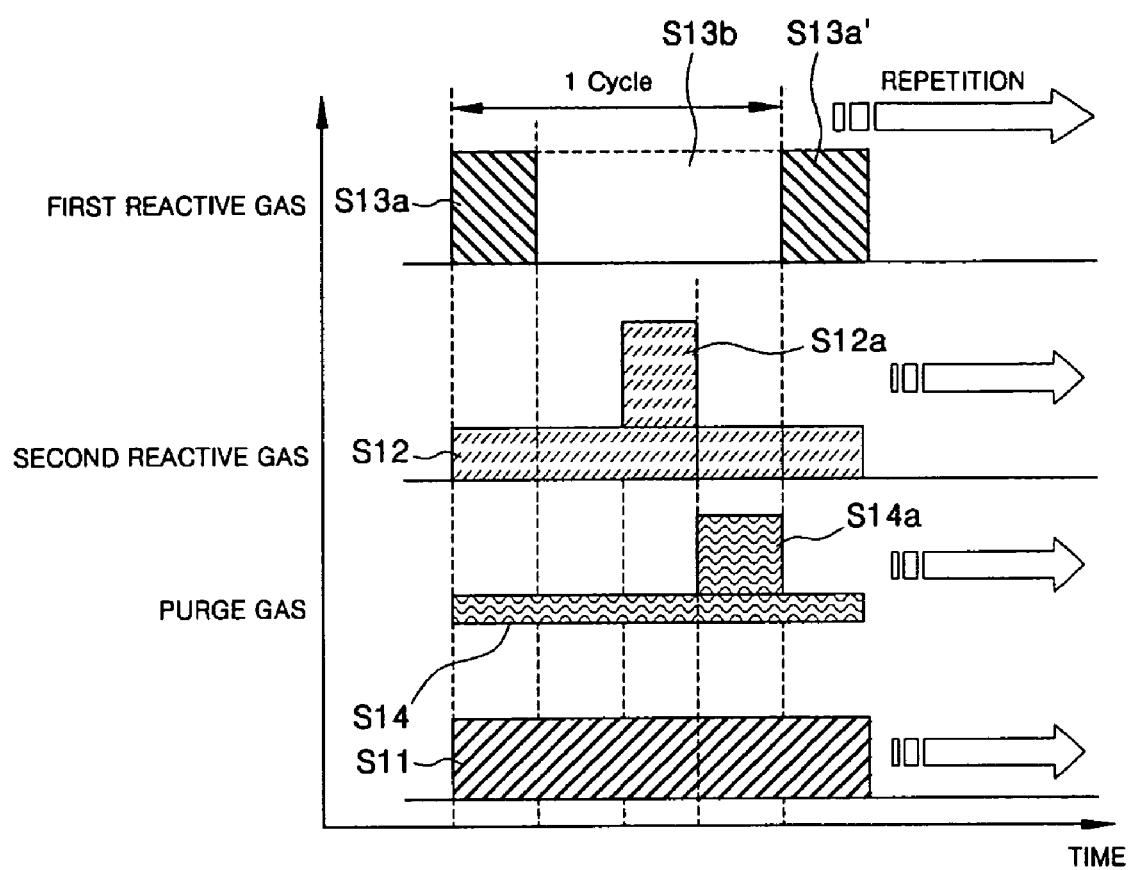
FIG. 17 illustrates a third example of a process sequence in which the Ti layer of FIG. 14 is formed.

FIG. 17 illustrates a third example of a process sequence in which the Ti layer of FIG. 14 is formed.

Referring to FIG. 17, in the third example in which the Ti layer is deposited using a plasma ALD process in the first chamber 20, while power is being supplied to the first chamber 20 so that plasma is continuously applied to the first chamber 20 (plasma continuous application operation S11), the second reactive gas is continuously sprayed onto the wafer "w" (second reactive gas continuous feeding operation S12), and a small purge gas is continuously supplied onto the wafer "w" (small purge gas continuous feeding operation S14) at the same time.

During the second reactive gas continuous feeding operation S12, first reactive gas feeding operation S13a of pulse-spraying the first reactive gas and first reactive gas purge operation S13b of purging the first reactive gas that is not absorbed on the wafer "w" are repeated in several cycles until the Ti layer is deposited on the wafer "w."

In this case, the second reactive gas continuous feeding operation S12 includes second reactive gas impulse operation S12a in which the second reactive gas is impulse-sprayed at a higher flow rate than a normal flow rate. The second reactive gas impulse operation S12a is performed during the first reactive gas purge operation S13b.

Also, the small purge gas continuous feeding operation S14 includes purge gas impulse operation S14a in which the purge gas is impulse-sprayed at a higher flow rate than a normal flow rate. The purge gas impulse operation S14a starts after the second reactive gas impulse operation S12a and comes to an end at the same time as when first reactive gas feeding operation S13' starts in the next cycle.

In other words, the third example is different from the second example in that a cycle includes the small purge gas continuous feeding operation S14, which includes the purge gas impulse operation S14a that starts at the same time as when the second reactive gas impulse operation S12a ends and comes to an end at the same time as when the first reactive gas feeding operation S13' starts in the next cycle.

Figure 18:
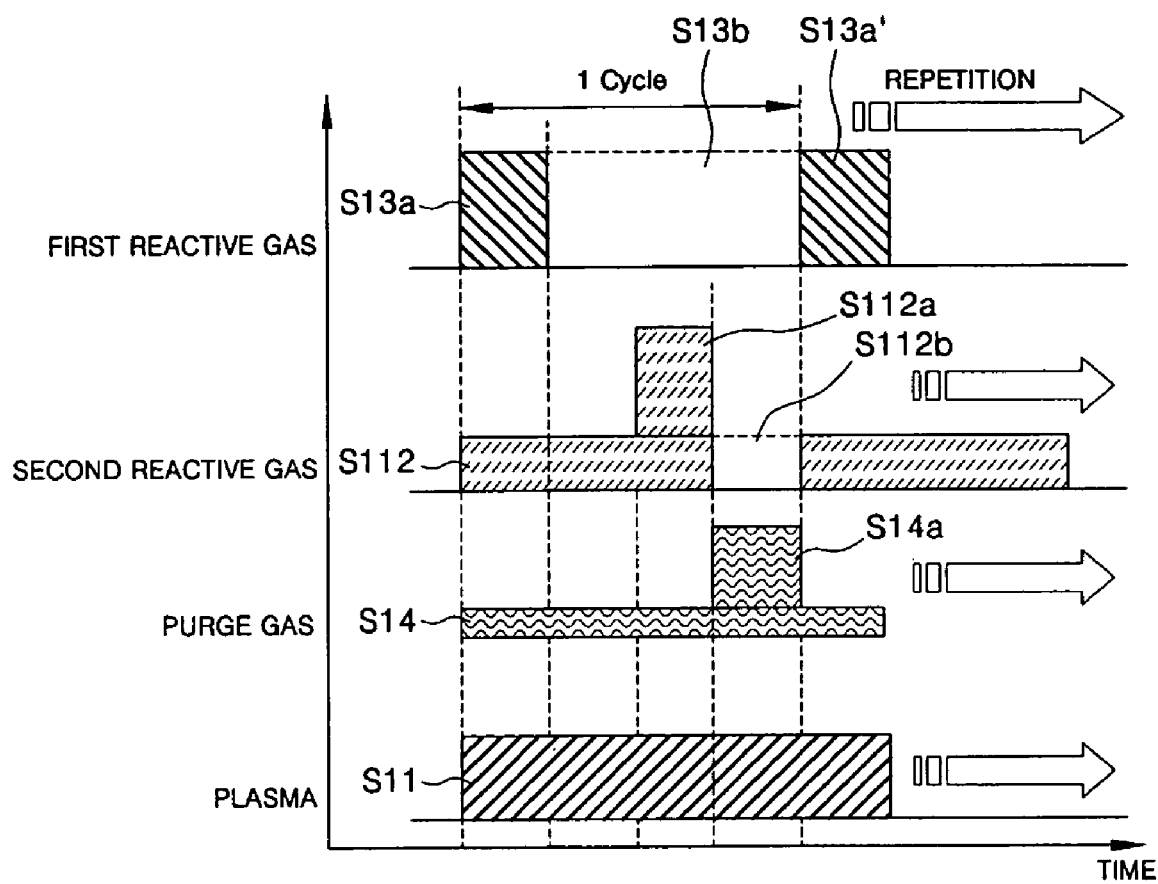
FIG. 18 illustrates a fourth example of a process sequence in which the Ti layer of FIG. 14 is formed.

FIG. 18 illustrates a fourth example of a process sequence in which the Ti layer of FIG. 14 is formed.

Referring to FIG. 18, in the fourth example in which the Ti layer is deposited using a plasma ALD process in the first chamber 20, while power is being supplied to the first chamber 20 so that plasma is continuously applied to the first chamber 20 (plasma continuous application operation S11), the second reactive gas is discontinuously sprayed onto the wafer "w" (second reactive gas discontinuous feeding operation S112), and a small purge gas is continuously supplied onto the wafer "w" (small purge gas continuous feeding operation S14) at the same time.

During the second reactive gas discontinuous feeding operation S112, first reactive gas feeding operation S13a of pulse-spraying the first reactive gas and first reactive gas purge operation S13b of purging the first reactive gas that is not absorbed on the wafer "w" are repeated in several cycles until the Ti layer is deposited on the wafer "w."

In this case, the second reactive gas discontinuous feeding operation S112 includes second reactive gas impulse operation S112a and second reactive gas feeding stop operation S112b. During the second reactive gas impulse operation S112a, the second reactive gas is impulse-sprayed at a higher flow rate than a normal flow rate. The second reactive gas impulse operation S112a is performed during the first reactive gas purge operation S13b. The second reactive gas feeding stop operation S112b starts after the second reactive gas impulse operation S112a and comes to an end at the same time as when first reactive gas feeding operation S13a' starts in the next cycle.

Also, the small purge gas continuous feeding operation S14 includes purge gas impulse operation S14a in which the purge gas is impulse-sprayed at a higher flow rate than a normal flow rate. The purge gas impulse operation S14a is performed at the same time as the second reactive gas feeding stop operation S112b.

In other words, the fourth example is different from the third example in that a cycle includes the second reactive gas discontinuous feeding operation S112, which is divided into the second reactive gas impulse operation S112a and the second reactive gas feeding stop operation S112b. Also, unlike in the third example, the small purge gas continuous feeding operation S14 includes the purge gas impulse operation S14a, which is performed at the same time as the second reactive gas feeding stop operation S112b.

Figure 19:
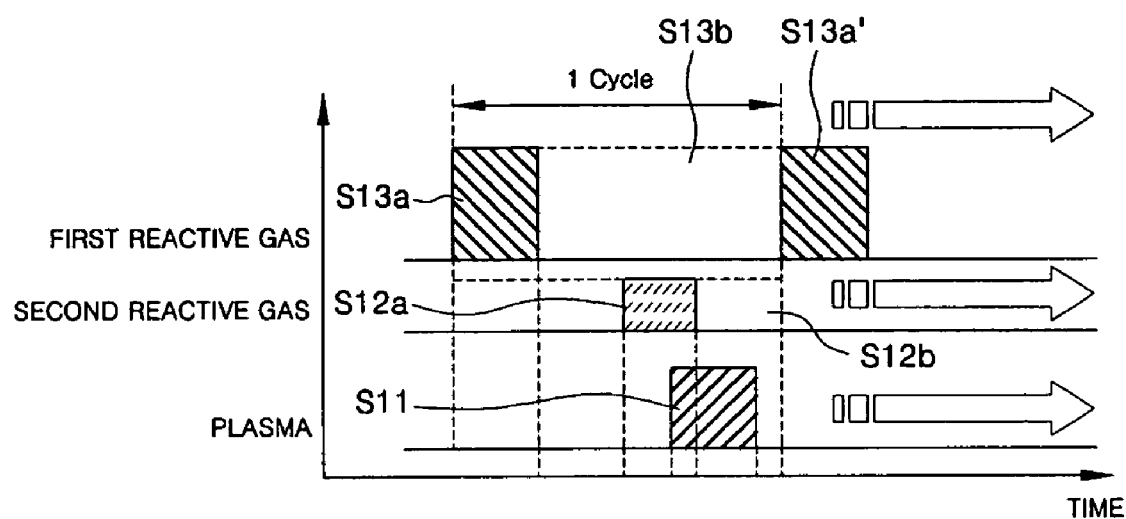
FIG. 19 illustrates a fifth example of a process sequence in which the Ti layer of FIG. 14 is formed.

FIG. 19 illustrates a fifth example of a process sequence in which the Ti layer of FIG. 14 is formed.

Referring to FIG. 19, in the fifth example in which the Ti layer is deposited using a plasma ALD process in the first chamber 20, first reactive gas feeding operation S13a of pulse-spraying the first reactive gas, first reactive gas purge operation S13b of purging the first reactive gas that is not absorbed on the wafer "w," second reactive gas feeding operation S12a of pulse-spraying the second reactive gas, and second reactive gas purge operation S12b of purging the second reactive gas that does not react with the first reactive gas absorbed on the wafer "w" or by-products that are generated by a reaction between the first and second gases are repeated in several cycles until the Ti layer is deposited on the wafer "w."

During the repetition of the cycle of operations S13a, S13b, S12a, and S12b, power is supplied to the first chamber 20 so that plasma is applied to the first chamber 20 (plasma application operation S11). The plasma application operation S11 starts during the second reactive gas feeding operation S12a and comes to an end before first reactive gas feeding operation S13a' starts in the next cycle.

Figure 20:
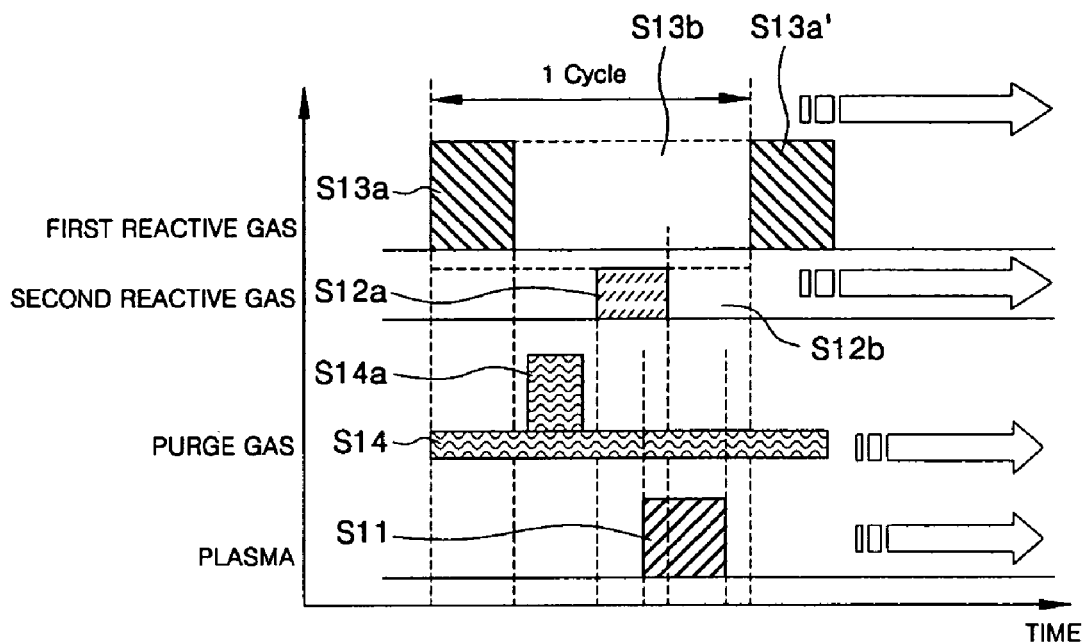
FIG. 20 illustrates a sixth example of a process sequence in which the Ti layer of FIG. 14 is formed.

FIG. 20 illustrates a sixth example of a process sequence in which the Ti layer of FIG. 14 is formed.

Referring to FIG. 20, in the sixth example in which the Ti layer is deposited using a plasma ALD process in the first chamber 20, first reactive gas feeding operation S13a of pulse-spraying the first reactive gas, first reactive gas purge operation S13b of purging the first reactive gas that is not absorbed on the wafer "w," second reactive gas feeding operation S12a of pulse-spraying the second reactive gas, and second reactive gas purge operation S12b of purging the second reactive gas that does not react with the first reactive gas absorbed on the wafer "w" or by-products that are generated by a reaction between the first and second gases are repeated in several cycles. During the repetition of the cycle of operations S13a, S13b, S12a, and S12b, a small purge gas is continuously supplied onto the wafer "w" (small purge gas continuous feeding operation S14). Thus, the Ti layer is deposited on the wafer "w."

During the repetition of the cycle of operations S13a, S13b, S12a, and S12b, power is supplied to the first chamber 20 so that plasma is applied to the first chamber 20 (plasma application operation S11). The plasma application operation S11 starts during the second reactive gas feeding operation S12a and comes to an end before first reactive gas feeding operation S13a' starts in the next cycle.

In this case, the small purge gas continuous feeding operation S14 includes purge gas impulse operation S14a in which the purge gas is impulse-sprayed at a higher flow rate than a normal flow rate. The purge gas impulse operation S14a starts after the first reactive gas feeding operation S13a and comes to an end before the second reactive gas feeding operation S12a starts.

In other words, the sixth example is different from the fifth example in that a cycle includes the small purge gas continuous feeding operation S14, which includes the purge gas impulse operation S14a that starts after the first reactive gas feeding operation S13a and comes to an end before the second reactive gas feeding operation S12a starts.

Figure 21:
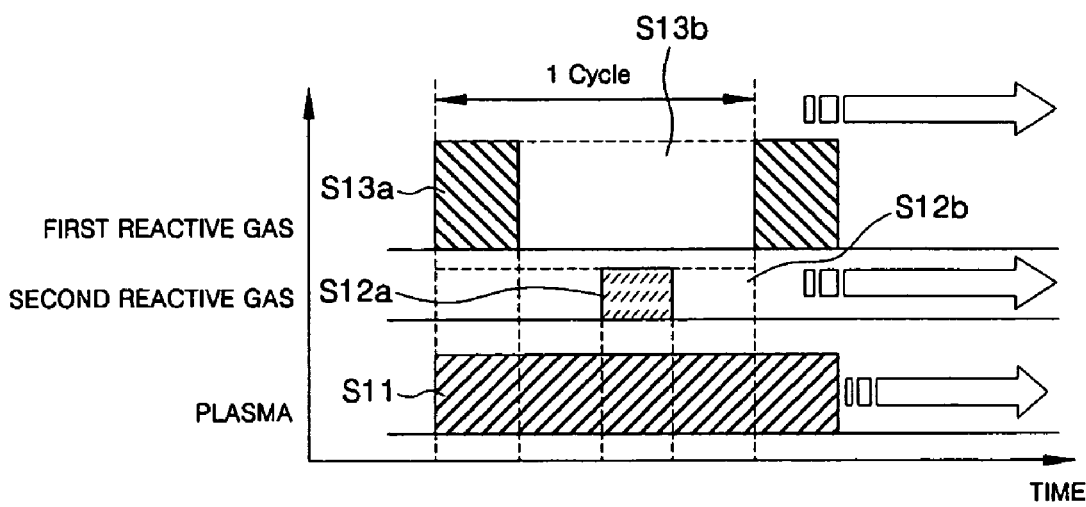
FIG. 21 illustrates a seventh example of a process sequence in which the Ti layer of FIG. 14 is formed.

FIG. 21 illustrates a seventh example of a process sequence in which the Ti layer of FIG. 14 is formed.

Referring to FIG. 21, in the seventh example in which the Ti layer is deposited using a plasma ALD process in the first chamber 20, first reactive gas feeding operation S13a of pulse-spraying the first reactive gas, first reactive gas purge operation S13b of purging the first reactive gas that is not absorbed on the wafer "w," second reactive gas feeding operation S12a of pulse-spraying the second reactive gas, and second reactive gas purge operation S12b of purging the second reactive gas that does not react with the first reactive gas absorbed on the wafer "w" or by-products that are generated by a reaction between the first and second gases are repeated in several cycles. During the repetition of the cycle of operations S13a, S13b, S12a, and S12b, power is supplied to the first chamber 20 so that plasma is continuously applied to the first chamber 20 (plasma continuous application operation S11). Thus, the Ti layer is deposited on the wafer "w."

Figure 22:
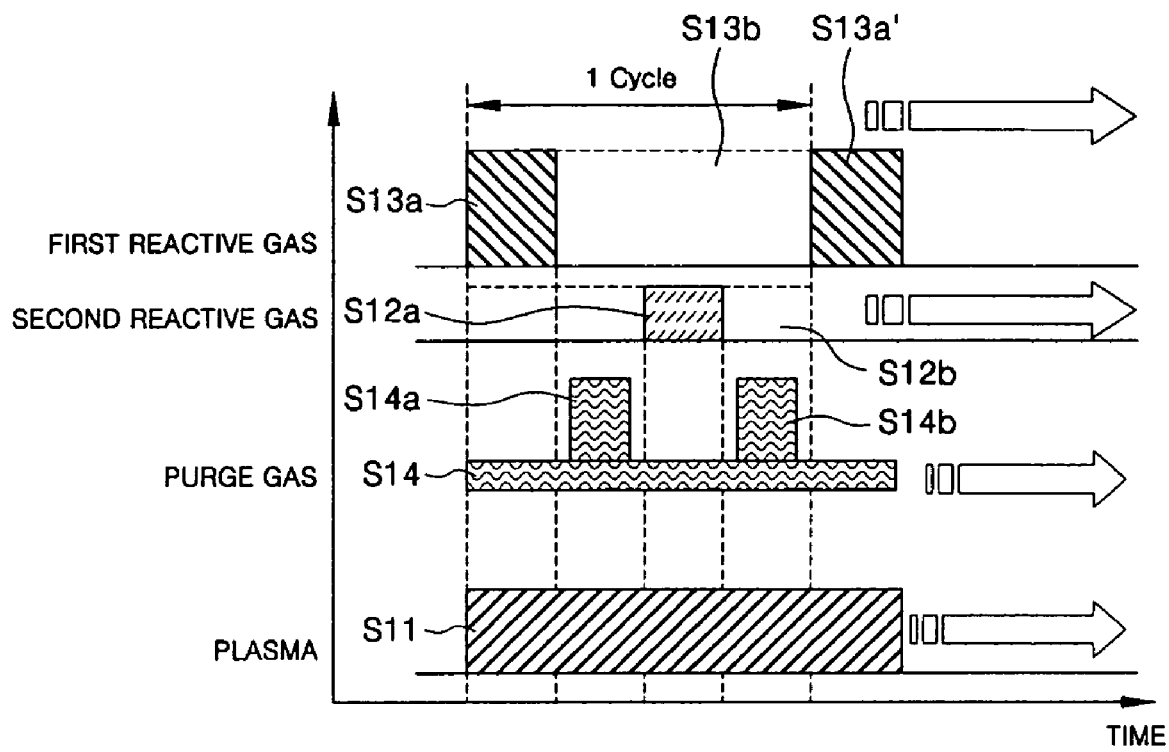
FIG. 22 illustrates an eighth example of a process sequence in which the Ti layer of FIG. 14 is formed.

FIG. 22 illustrates an eighth example of a process sequence in which the Ti layer of FIG. 14 is formed.

Referring to FIG. 22, in the eighth example in which the Ti layer is deposited using a plasma ALD process in the first chamber 20, first reactive gas feeding operation S13a of pulse-spraying the first reactive gas, first reactive gas purge operation S13b of purging the first reactive gas that is not absorbed on the wafer "w," second reactive gas feeding operation S12a of pulse-spraying the second reactive gas, and second reactive gas purge operation S12b of purging the second reactive gas that does not react with the first reactive gas absorbed on the wafer "w" or by-products that are generated by a reaction between the first and second gases are repeated in several cycles. During the repetition of the cycle of operations S13a, S13b, S12a, and S12b, a small purge gas is continuously supplied onto the wafer "w" (small purge gas continuous feeding operation S14), and power is supplied to the first chamber 20 so that plasma is continuously applied to the first chamber 20 (plasma continuous application operation S11) at the same time. Thus, the Ti layer is deposited on the wafer "w."

In this case, the small purge gas continuous feeding operation S14 includes first purge gas impulse operation S14a in which a first purge gas is impulse-sprayed at a higher flow rate than a normal flow rate and second purge gas impulse operation S14b in which a second purge gas is impulse-sprayed at a higher flow rate than a normal flow rate. The first purge gas impulse operation S14a starts after the first reactive gas feeding operation S13a and comes to an end before the second reactive gas feeding operation S12a starts, and the second purge gas impulse operation S14b starts after the second reactive gas feeding operation S12a and comes to an end before first reactive gas feeding operation S13a' starts in the next cycle.

In other words, the eighth example is different from the seventh example in that a cycle includes the small purge gas continuous feeding operation S14 in which a small purge gas is continuously supplied onto the wafer "w," and the small purge gas continuous feeding operation S14 includes the first purge gas impulse operation S14a, which starts after the first reactive gas feeding operation S13a and ends before the second reactive gas feeding operation S12a starts, and the second purge gas impulse operation S14b, which starts after the second reactive gas feeding operation S12a and ends before first reactive gas feeding operation S13a' starts in the next cycle.

In the present invention, the third embodiment of the in-situ thin-film deposition method is clearly different from the first and second embodiments. That is, in comparison to the first and second embodiments in which a $TiSi_x$ layer structure as a resistive contact region is obtained using an artificial deposition method, the third embodiment provides a $TiSi_x$ layer generated by a combination reaction between a Si underlying layer and a Ti deposition layer. In this case, the thickness of a $TiSi_x$ region depends on a chamber, geometry, and specific process conditions, but it is fundamentally inevitable to heat a wafer to a sufficient high temperature. Accordingly, in the third embodiment, the wafer is set to a higher temperature than in the first and second embodiments.

According to the In-situ thin-film deposition method of the present invention as described above, a $TiSi_x$ layer is deposited as a resistive region on a wafer, and a Ti layer or a Ti/TiN layer can be continuously and effectively deposited on the $TiSi_x$ layer.

Also, low-power plasma is applied to a chamber at a low temperature of 600° C. or less so that a Ti layer or Ti/TiN layer can be continuously deposited on a $TiSi_x$ layer.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An in-situ thin-film deposition method for depositing a thin layer as a resistive contact and barrier on a loaded wafer, which is performed in a thin-film deposition apparatus comprising a transfer chamber including a robot arm and a plurality of chambers installed as a cluster type on the transfer chamber, the method comprising:

depositing a $TiSi_x$ layer on the wafer by supplying a first reactive gas containing Ti and a second reactive gas containing Si to a first chamber; and transferring the wafer to a second chamber using the transfer chamber and depositing a TiN layer on the $TiSi_x$ layer, wherein when the $TiSi_x$ layer is deposited using a plasma ALD process, continuously applying plasma to the first chamber by supplying power to the first chamber and continuously spraying the second reactive gas onto the wafer are performed at the same time, wherein during the continuous spraying of the second reactive gas, pulse-spraying the first reactive gas and purging the first reactive gas that is not absorbed on the wafer are repeated in several cycles until the $TiSi_x$ layer is deposited on the wafer.

2. The method of claim 1, further comprising a post-processing operation, which comprises:

transferring the wafer on which the $TiSi_x$ layer or $TiSi_x$/Ti layer is formed to a post-processing chamber through the transfer chamber; and spraying an H-containing post-processing gas onto the wafer to reduce the content of impurities in the $TiSi_x$ layer or $TiSi_x$/Ti layer.

3. The method of claim 2, wherein the post-processing gas further contains N and is sprayed onto the wafer so that the content of impurities in the $TiSi_x$ layer or $TiSi_x$/Ti layer is further reduced and a top surface of the $TiSi_x$ layer or $TiSi_x$/Ti layer is nitrified.

4. The method of claim 3, wherein the post-processing operation is performed by applying plasma to the post-processing chamber.

5. The method of claim 1, wherein the first reactive gas is one selected from the group consisting of $TiCl_4$, TEMATi, and TDMATi, and the second reactive gas is one of $SiH_4$ and DCS.

6. The method of claim 1, wherein the $TiSi_x$ layer is deposited on the wafer maintained at a temperature of 550° C. or less in the first chamber maintained under a pressure of 0.1 to 10 Torr.

7. The method of claim 1, wherein when the $TiSi_x$ layer is deposited using a plasma ALD process, at least one selected from the group consisting of Ar, He, Ne, Xe, and $N_2$ is used as a purge gas.

8. An in-situ thin-film deposition method for depositing a thin layer as a resistive contact and barrier on a loaded wafer, which is performed in a thin-film deposition apparatus comprising a transfer chamber including a robot arm and first, second, third, and fourth chambers installed as a cluster type on the transfer chamber, the method comprising:
- depositing a $TiSi_x$ layer on the wafer by supplying a first reactive gas containing Ti and a second reactive gas containing Si to the first chamber;
- depositing a Ti layer on the $TiSi_x$ layer, which is a glue layer; and
- transferring the wafer to the third chamber and depositing a TiN layer on the Ti layer,
- wherein when the $TiSi_x$ layer is deposited using a plasma ALD process, continuously applying plasma to the first chamber by supplying power to the first chamber and continuously spraying the second reactive gas onto the wafer are performed at the same time,
- wherein during the continuous spraying of the second reactive gas, pulse-spraying the first reactive gas and purging the first reactive gas that is not absorbed on the wafer are repeated in several cycles until the $TiSi_x$ layer is deposited on the wafer.

9. The method of claim 8, wherein the Ti layer is deposited after the wafer on which the $TiSi_x$ is deposited is transferred to another chamber.

* * * * *